US012642058B2

(12) United States Patent
Chen

(10) Patent No.: US 12,642,058 B2
(45) Date of Patent: May 26, 2026

(54) SEMICONDUCTOR DEVICE AND METHOD FOR FABRICATING THE SAME

(71) Applicant: UNITED MICROELECTRONICS CORP., Hsin-Chu City (TW)

(72) Inventor: Kuan-Ting Chen, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 5 days.

(21) Appl. No.: 18/109,864

(22) Filed: Feb. 15, 2023

(65) Prior Publication Data

US 2023/0197451 A1    Jun. 22, 2023

Related U.S. Application Data

(62) Division of application No. 17/001,697, filed on Aug. 25, 2020, now Pat. No. 11,610,777.

(30) Foreign Application Priority Data

Jul. 31, 2020    (CN) .......................... 202010756098.9

(51) Int. Cl.
*H10P 76/40*       (2026.01)
*H10D 30/01*      (2025.01)
*H10D 64/01*      (2025.01)
*H10P 50/00*      (2026.01)

(52) U.S. Cl.
CPC ....... *H10P 76/4085* (2026.01); *H10D 30/024* (2025.01); *H10D 64/015* (2025.01); *H10P 50/73* (2026.01)

(58) Field of Classification Search
CPC ............. H01L 21/0337; H01L 29/6653; H01L 21/3086; H01L 29/66795
See application file for complete search history.

(56) References Cited

U.S. PATENT DOCUMENTS

| | | | |
|---|---|---|---|
| 7,115,525 B2 | 10/2006 | Abatchev et al. | |
| 7,666,578 B2 | 2/2010 | Fischer et al. | |
| 9,324,570 B1* | 4/2016 | Liou ................... | H01L 21/0338 |
| 9,911,619 B1* | 3/2018 | Xie ................... | H01L 29/66795 |
| 9,953,875 B1 | 4/2018 | Cheng | |
| 10,304,744 B1* | 5/2019 | Joseph ............... | H01L 21/0228 |

(Continued)

FOREIGN PATENT DOCUMENTS

| | | |
|---|---|---|
| CN | 108122765 A | 6/2018 |
| CN | 109427777 A | 3/2019 |
| CN | 110034188 A | 7/2019 |

OTHER PUBLICATIONS

Tung, the specification, including the claims, and drawings in the U.S. Appl. No. 13/676,185 , filed Nov. 14, 2012.

*Primary Examiner* — Chad M Dicke
*Assistant Examiner* — Valerie N Newton
(74) *Attorney, Agent, or Firm* — Winston Hsu

(57) ABSTRACT

A method for fabricating semiconductor device includes the steps of: forming a hard mask on a substrate; forming a first mandrel and a second mandrel on the hard mask; forming a first spacer and a second spacer around the first mandrel and a third spacer and a fourth spacer around the second mandrel; removing the second mandrel; forming a patterned mask on the first mandrel, the first spacer, the second spacer, the third spacer, and the fourth spacer; and using the patterned mask to remove the third spacer and the hard mask.

14 Claims, 4 Drawing Sheets

(56) References Cited

U.S. PATENT DOCUMENTS

| | | | | |
|---|---|---|---|---|
| 10,535,654 | B2 | 1/2020 | Tsai | |
| 10,770,302 | B2 * | 9/2020 | Wang | H10D 30/024 |
| 11,328,949 | B2 * | 5/2022 | Na | H01L 27/088 |
| 2006/0046484 | A1 * | 3/2006 | Abatchev | H01L 21/0337 |
| | | | | 438/689 |
| 2013/0115777 | A1 | 5/2013 | Tung | |
| 2014/0203279 | A1 * | 7/2014 | Bello | H01L 22/12 |
| | | | | 438/16 |
| 2015/0064912 | A1 * | 3/2015 | Jang | H01L 21/32139 |
| | | | | 438/696 |
| 2019/0088551 | A1 | 3/2019 | Kim | |
| 2019/0393303 | A1 | 12/2019 | Choi | |
| 2020/0051976 | A1 * | 2/2020 | Ha | H10D 84/038 |

* cited by examiner

SEMICONDUCTOR DEVICE AND METHOD FOR FABRICATING THE SAME

CROSS REFERENCE TO RELATED APPLICATIONS

This application is a division of U.S. application Ser. No. 17/001,697, filed on Aug. 25, 2020. The content of the application is incorporated herein by reference.

BACKGROUND OF THE INVENTION

1. Field of the Invention

The invention relates to a method for fabricating semiconductor device, and more particularly to a method of using pattern transfer process to form fin field effect transistor (FinFET) on the substrate.

2. Description of the Prior Art

With increasing miniaturization of semiconductor devices, it is crucial to maintain the efficiency of miniaturized semiconductor devices in the industry. However, as the size of the field effect transistors (FETs) is continuously shrunk, the development of the planar FETs faces more limitations in the fabricating process thereof. On the other hand, non-planar FETs, such as the fin field effect transistor (Fin FET) have three-dimensional structure, not only capable of increasing the contact to the gate but also improving the controlling of the channel region, such that the non-planar FETs have replaced the planar FETs and become the mainstream of the development.

The current method of forming the Fin FETs is forming a fin structure on a substrate primary, and then forming a gate on the fin structure. The fin structure generally includes the stripe-shaped fin formed by etching the substrate. However, under the requirements of continuous miniaturization, the width of each fin, as well as the pitch between fins have to be shrunk accordingly. Thus, the fabricating process of the Fin FETs also faces more challenges and limitations. For example, the fabricating process is limited by current mask and lithography techniques, such that it has problems to precisely define the position of the fin structure, or to precisely control the etching time, thereby leading to the fin collapse or over-etching issues, and seriously affecting the efficiency of the fin structure.

SUMMARY OF THE INVENTION

According to an embodiment of the present invention, a method for fabricating semiconductor device includes the steps of: forming a hard mask on a substrate; forming a first mandrel and a second mandrel on the hard mask; forming a first spacer and a second spacer around the first mandrel and a third spacer and a fourth spacer around the second mandrel; removing the second mandrel; forming a patterned mask on the first mandrel, the first spacer, the second spacer, the third spacer, and the fourth spacer; and using the patterned mask to remove the third spacer and the hard mask.

According to another aspect of the present invention, a semiconductor device includes a base on a substrate and a first fin-shaped structure adjacent to the base. Preferably, a surface of the substrate between the base and the first fin-shaped structure includes a first curve concave upward.

According to yet another aspect of the present invention, a semiconductor device includes a base on a substrate and a first fin-shaped structure adjacent to the base. Preferably, a surface of the substrate between the base and the first fin-shaped structure includes a curve concave downward.

These and other objectives of the present invention will no doubt become obvious to those of ordinary skill in the art after reading the following detailed description of the preferred embodiment that is illustrated in the various figures and drawings.

DETAILED DESCRIPTION

Figures 1, 2:
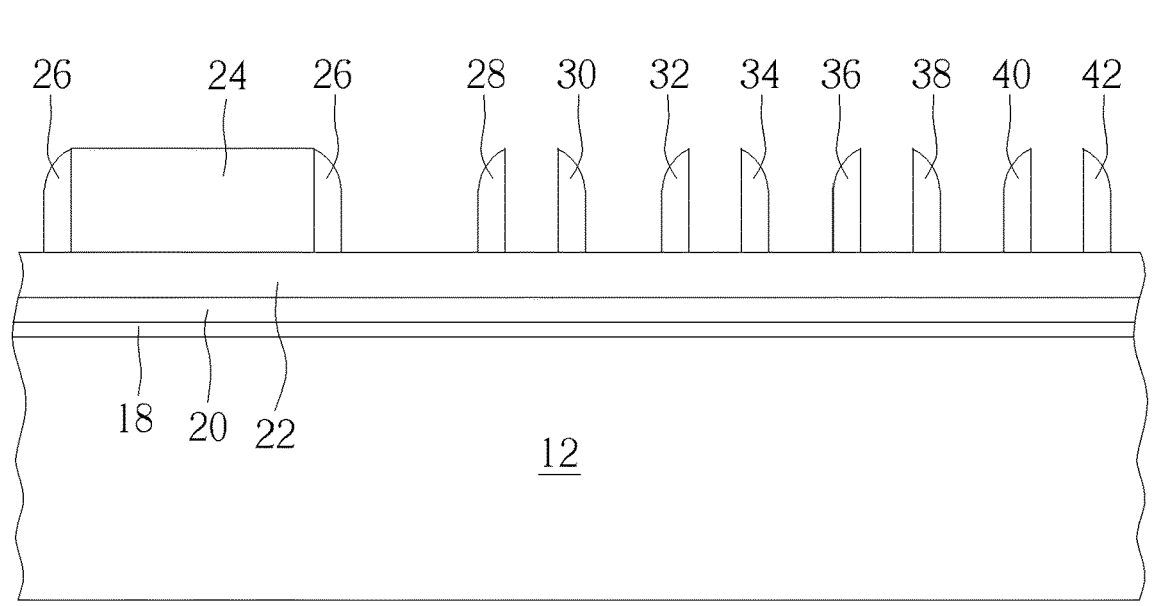
FIGS. 1-6 illustrate a method for fabricating a semiconductor device according to an embodiment of the present invention.

Referring to FIGS. 1-6, FIGS. 1-6 illustrate a method for fabricating a semiconductor device according to an embodiment of the present invention. As shown in FIG. 1, a substrate 12, such as silicon substrate is provided, and a first region 14 and a second region 16 are defined on the substrate 12. Preferably, the first region 14 and the second region 16 are used to fabricate different types of semiconductor devices in the later process, in which the first region 14 in this embodiment is used for fabricating planar MOS transistors and the second region 16 could be used to fabricate FinFET devices or SRAM devices.

Next, a pad layer 18, a pad layer 20, and a hard mask 20 are formed on the substrate 12, in which the pad layer 18 preferably includes silicon oxide, the pad layer 20 preferably includes silicon nitride, and the hard mask 22 preferably includes silicon oxide, but not limited thereto. Next, a plurality of mandrels 24 are formed on the hard mask 22. In this embodiment, the formation of the mandrels 24 could be accomplished by first forming a material layer (not shown) on the substrate 12, and a pattern transfer process is conducted by using etching to remove part of the material layer for forming a plurality of patterned material layers serving as mandrels 16 on the substrate 12. Preferably, the mandrels 24 could be selected from the group consisting of amorphous silicon, polysilicon, silicon oxide, and silicon nitride, but not limited thereto. Moreover, the width of the mandrel 24 on the first region 14 is preferably greater than the width of each of the mandrels 24 on the second region 16 and the mandrels 24 on both first region 14 and second region 16 could have same pitch or different pitches therebetween.

Next, as shown in FIG. 2, a cap layer (not shown) is formed to cover the mandrels 24 and the hard mask 22, and an etching back process is conducted to remove part of the cap layer for forming spacers 26, 28, 30, 32, 34, 36, 38, 40, 42 adjacent to the mandrels 24. Next, a patterned mask (not shown) could be formed to cover the first region 14, and an etching process is conducted by using the patterned mask as mask to remove all of the mandrels 24 on the second region 16. After stripping the patterned mask, a mandrel 24 and spacers 26 are remained on the first region 14 while only spacers 28, 30, 32, 34, 36, 38, 40, 42 are remained on the second region 16.

Figure 3:
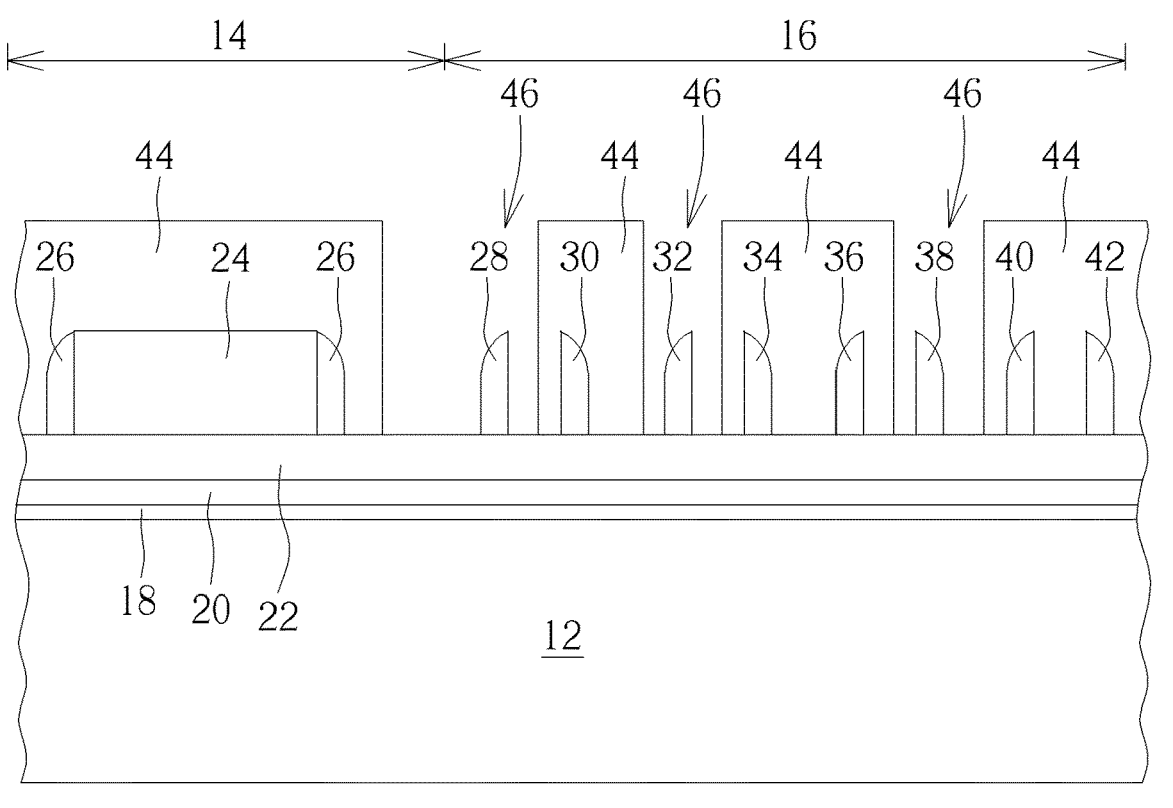

Next, as shown in FIG. 3, a patterned mask 44 such as a patterned resist is formed on the hard mask 22 to cover the mandrel 24 and spacers 26 on the first region 14 and part of the spacers including spacers 30, 34, 36, 40, 42 on the second region 16. Preferably, the patterned mask 44 includes a plurality of openings 46 exposing the exposed spacers 28, 32, 38.

Figure 4:
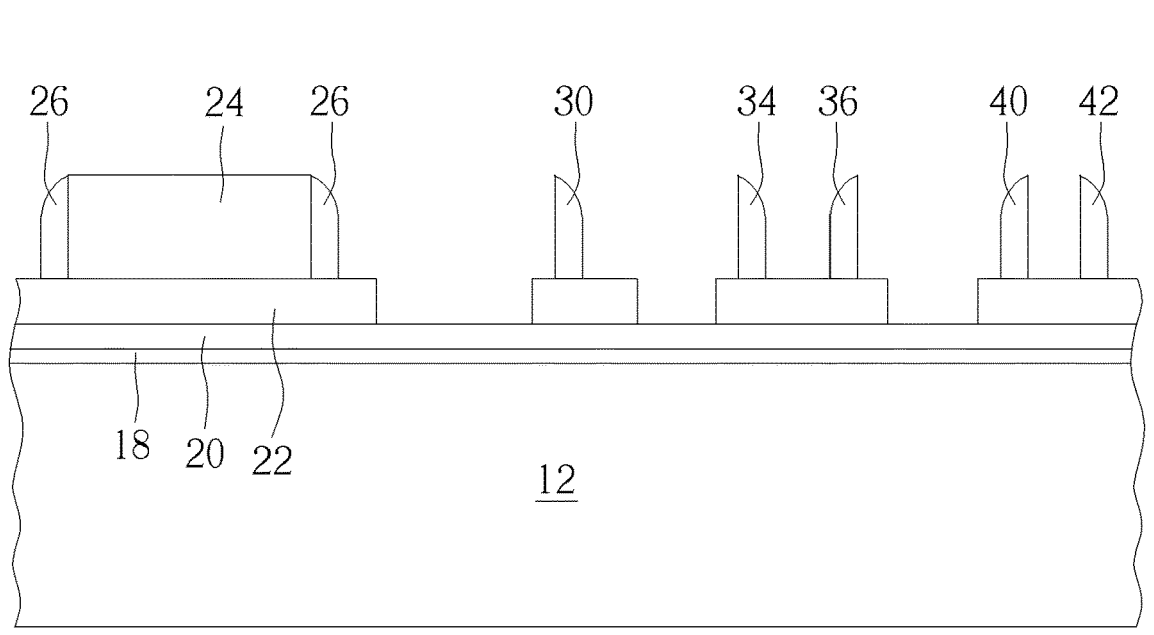

Next, as shown in FIG. 4, an etching process is conducted by using the patterned mask 44 as mask to remove the spacers 28, 32, 38 and part of the hard mask 22 on the second region 16. After stripping the patterned mask 44, the mandrel 24 and spacers 26 on the first region 14 and the spacers 30, 34, 36, 40, 42 on the second region 16 are exposed, in which the mandrel 24 and spacers 26 on the first region 14 and the spacers 30, 34, 36, 40, 42 on the second region 16 are both disposed on the patterned hard mask 22.

After stripping the patterned mask 44, a selective fin-cut process could be conducted to remove part of the spacers 40, 42 on the second region 16 so that the remaining spacers 40, 42 are still disposed on the patterned hard mask 22. It should be noted that if viewed from a top view perspective, the spacers 40, 42 before the fin-cut process would reveal a substantially ring-shaped pattern on the patterned hard mask 22. Since the pattern of each of the spacers corresponds to the pattern of fin-shaped structures formed afterwards, the fin-cut process conducted at this stage preferably involves using an etching process to remove part of the spacers 40, 42 and transform the ring-shaped spacers 40, 42 into independent rectangular spacers 40, 42 standing on the hard mask 22. If viewed from a cross-section perspective the spacers 40, 42 still look individually independent from each other on the hard mask 22.

Figure 5:
Figure 5:
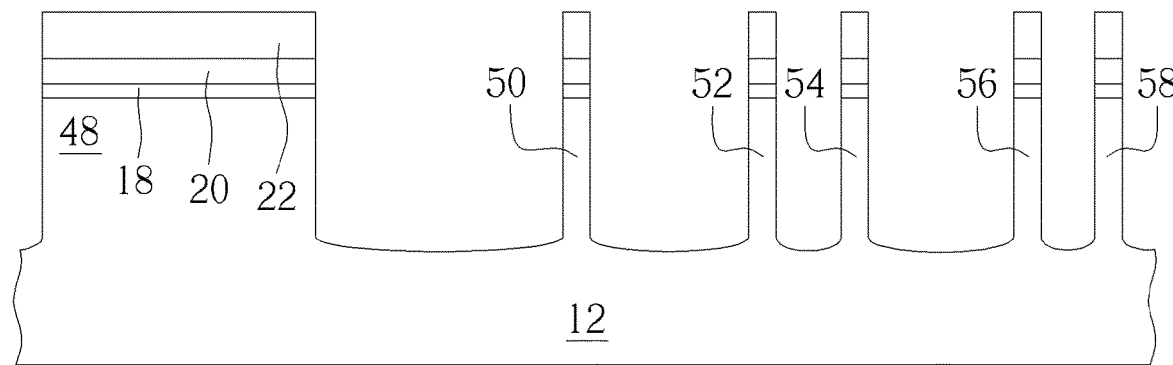

Next, as shown in FIG. 5, the mandrel 24 and spacers 26 on the first region 14 and the spacers 30, 34, 36, 40, 42 on the second region 16 are used as mask to remove the hard mask 22, the pad layer 20, the pad layer 18, and the substrate 12 to form a base 48 on the first region 14 and a plurality of fin-shaped structures 50, 52, 54, 56, 58 on the second region 16. The mandrel 24 and spacers 26 on the first region 14 and spacers 30, 34, 36, 40, 42 on the second region 16 are removed thereafter.

Figure 6:
Figure 6:
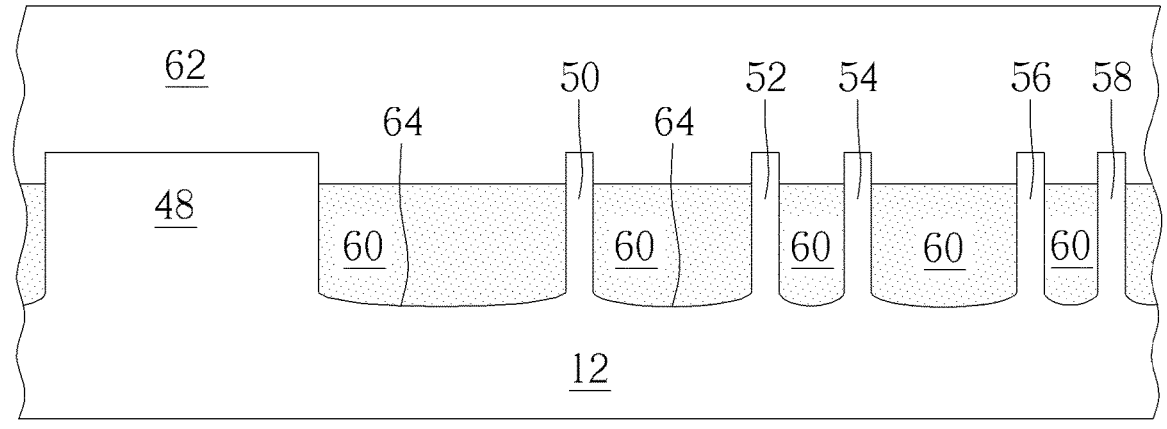

Next, as shown in FIG. 6, a shallow trench isolation (STI) 60 is formed around the base 48 and fin-shaped structures 50, 52, 54, 56, 58. In this embodiment, the formation of the STI 60 could be accomplished by using a flowable chemical vapor deposition (FCVD) process to form a silicon oxide layer (not shown) on the substrate 12 to cover the base 48 and the fin-shaped structures 50, 52, 54, 56, 58 and then removing part of the silicon oxide layer, the hard mask 22, the pad layer 20, and the pad layer 18 so that the top surface of the remaining silicon oxide layer is even with or slightly higher than the surface of the fin-shaped structures 50, 52, 54, 56, 58.

Next, an ion implantation process is conducted to implant n-type or p-type dopants into the base 48 and fin-shaped structures 50, 52, 54, 56, 58 and a thermal treatment process is conducted to diffuse the implanted dopants for forming well regions (not shown). Next, follow-up transistor fabrication process could be carried out by first removing part of the STI 60 so that the top surface of the STI 60 is slightly lower than the top surface of the fin-shaped structures 50, 52, 54, 56, 58, forming a gate structure 62 made of polysilicon on the base 48 and the fin-shaped structures 50, 52, 54, 56, 58, forming spacers on sidewalls of the gate structure 62, and then forming source/drain regions in the fin-shaped structures adjacent to two sides of the spacers. Since the fabrication of a standard transistor is well known to those skilled in the art, the details of which are not explained herein for the sake of brevity.

In this embodiment, the etching recipe used for forming the base 48 and the fin-shaped structures 50, 52, 54, 56, 58 could include hydrogen bromide (HBr) and/or carbon tetrafluoride (CF$_4$), in which the flow rate of HBr and CF$_4$ is preferably between 0-500 sccm. Specifically, it would be desirable to increase the ratio of HBr during the etching process for forming curves 64 concave upward on the surface of the substrate 12 between the base 48 and the fin-shaped structures 50, 52, 54, 56, 58 as shown in FIG. 6, in which the curve 64 concave upward between the base 48 and the fin-shaped structure 50 and the curves 64 between the fin-shaped structures 50, 52, 54, 56, 58 despite having different pitches could have same curvature or different curvatures. In this embodiment, the pitch between the fin-shaped structures 52, 54 is preferably less than the pitch between fin-shaped structures 50, 52, the pitch between fin-shaped structures 50, 52 is less the pitch between the base 48 and the fin-shaped structure 50, and the curvature of the curves 64 between the fin-shaped structures 50, 52 or between fin-shaped structures 50, 52 is preferably equal to the curvature of the curve between the base 48 and the fin-shaped structure 50.

Figure 7:
FIG. 7 illustrates a structural view of a semiconductor device according to an embodiment of the present invention.
Figure 7:
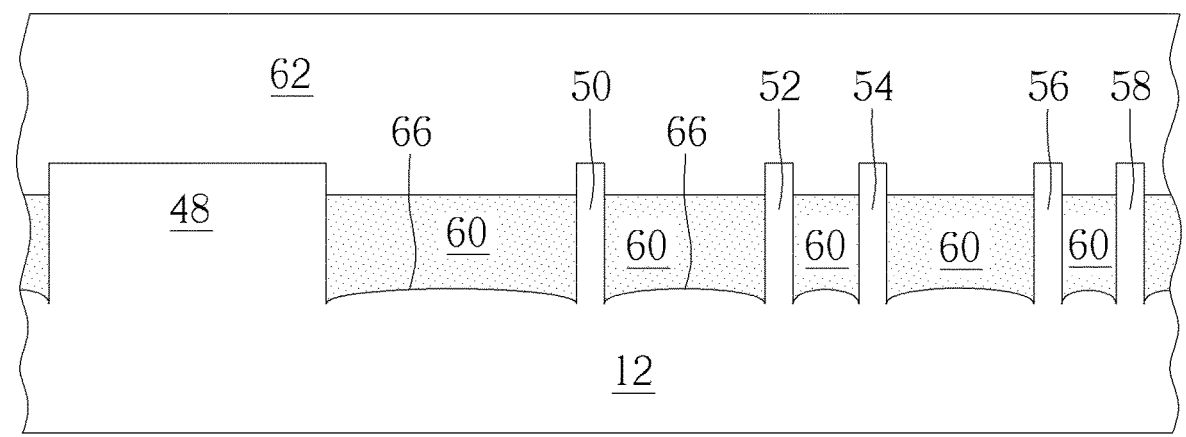

In addition to the aforementioned approach of adjusting the ratio of HBr to form the curves 64 concave upward as shown in FIG. 6, it would also be desirable to increase the ratio of CF$_4$ during the etching process for forming curves 66 concave downward on the surface of the substrate 12 between the base 48 and the fin-shaped structures 50, 52, 54, 56, 58 as shown in FIG. 7. Similar to the embodiment disclosed in FIG. 6, the curve 66 concave downward between the base 48 and the fin-shaped structure 50 and the curves 66 between the fin-shaped structures 50, 52, 54, 56, 58 despite having different pitches could have same curvature or different curvatures as shown in FIG. 7. In this embodiment, the pitch between the fin-shaped structures 52, 54 is preferably less than the pitch between fin-shaped structures 50, 52, the pitch between fin-shaped structures 50, 52 is less the pitch between the base 48 and the fin-shaped structure 50, and the curvature of the curves 64 between the fin-shaped structures 50, 52 or between fin-shaped structures 50, 52 is preferably equal to the curvature of the curve between the base 48 and the fin-shaped structure 50.

Moreover, in alternative to the aforementioned embodiment of adjusting the ratio of gas during the etching process to form curves 64 concave upward or curves concave downward 66 on the surface of the substrate 12, it would also be desirable to adjust the electrical potential of top and bottom electrodes for obtaining similar results. For instance, it would be desirable to use a smaller electrical potential to obtain the curves 64 concave upward as shown in FIG. 6, a mid-level electrical potential to form a completely planar surface on the substrate 12 between the base 48 and the fin-shaped structure 50 or between the fin-shaped structures 50, 52, 54, 56, 58, or a greater electrical potential to obtain the curves 66 concave downward as shown in FIG. 7, which are all within the scope of the present invention.

Overall, in contrast to the conventional approach for fabricating fin-shaped structures of conducting multiple pattern transfer process to transfer the pattern of mandrels onto hard mask or pad layer, the present invention preferably uses a patterned mask 44 to remove part of the spacer adjacent to the mandrels for defining the pattern of the fin-shaped structures formed afterwards on the hard mask 22, conducts a fin-cut process, and then conducts an etching process by using the remaining mandrel and spacers at the same time to form a base 48 having greater pitch and fin-shaped structures 50, 52, 54, 56, 58. Since the present invention moves the fin-cut process to the stage where spacers are used to pattern material layers such as hard mask, pad layer, and substrate for forming fin-shaped structures, it would be desirable to prevent the bottom surface of the substrate between fin-shaped structures from having voids formed during the fin-cut process so that uniformity of the substrate between fin-shaped structures could be maintained.

According to another embodiment of the present invention, it would also be desirable to adjust the flow rate or ratio of HBr and/or $CF_4$ when part of the substrate is removed to form fin-shaped structures so that the surface of the substrate between the base and fin-shaped structures could form continuous curves concave upward as shown in FIG. 6 or curves concave downward as shown in FIG. 7, in which the curves concave upward or concave downward could be used for adjusting the stress between the surface of the substrate 12 and the STI 60.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:

forming a hard mask on a substrate;

forming a first mandrel and a second mandrel on the hard mask, wherein a width of the first mandrel is greater than a width of the second mandrel;

forming a first spacer and a second spacer around the first mandrel and a third spacer and a fourth spacer around the second mandrel;

removing the second mandrel;

forming a patterned mask on the first mandrel, the first spacer, the second spacer, and the fourth spacer, wherein a bottom surface of the pattered mask overlying the first mandrel and the first spacer is coplanar with bottom surfaces of the first mandrel and the first spacer; and using the same patterned mask to remove both the third spacer and the hard mask directly under the third spacer.

2. The method of claim 1, further comprising:

forming a first pad layer on the substrate;

forming a second pad layer on the first pad layer; and forming the hard mask after forming the second pad layer.

3. The method of claim 2, wherein the first pad layer and the second pad layer comprise different materials.

4. The method of claim 2, further comprising:

removing the patterned mask; and using the first mandrel, the first spacer, the second spacer, and the fourth spacer to remove the hard mask, the second pad layer, the first pad layer, and the substrate for forming a base and a fin-shaped structure.

5. The method of claim 4, further comprising performing a fin-cut process after removing the patterned mask.

6. The method of claim 5, further comprising removing the hard mask, the second pad layer, the first pad layer, and the substrate after performing the fin-cut process.

7. The method of claim 4, wherein a surface of the substrate between the base and the fin-shaped structure comprises a curve concave upward.

8. The method of claim 4, wherein a surface of the substrate between the base and the fin-shaped structure comprises a curve concave downward.

9. A semiconductor device, comprising:

a base on a substrate;

a first fin-shaped structure adjacent to the base, wherein a surface of the substrate between the base and the first fin-shaped structure comprises a first curve continuously concave downward between the base and the first fin-shaped structure;

a shallow trench isolation (STI) around the base and the first fin-shaped structure, wherein a bottom surface of the STI conforms to the first curve, and a top surface of the STI comprises a planar surface lower than a top surface of the first fin-shaped structure; and a gate structure disposed on the base, the STI, and the fin-shaped structure.

10. The semiconductor device of claim 9, wherein top surfaces of the base and the first fin-shaped structure are coplanar.

11. The semiconductor device of claim 9, further comprising a second fin-shaped structure adjacent to the first fin-shaped structure, wherein a surface of the substrate between the first fin-shaped structure and the second fin-shaped structure comprises a second curve concave downward.

12. The semiconductor device of claim 11, wherein the first curve and the second curve comprise same curvature.

13. The semiconductor device of claim 11, wherein the first curve and the second curve comprise different curvatures.

14. The semiconductor device of claim 9, wherein a pitch between the first fin-shaped structure and the second fin-shaped structure is less than a pitch between the base and the first fin-shaped structure.

* * * * *